United States Patent
Xu

(10) Patent No.: US 11,810,639 B2
(45) Date of Patent: Nov. 7, 2023

(54) TEST METHOD AND TEST SYSTEM

(71) Applicant: CHANGXIN MEMORY TECHNOLOGIES, INC., Hefei (CN)

(72) Inventor: Jinghong Xu, Hefei (CN)

(73) Assignee: CHANGXIN MEMORY TECHNOLOGIES, INC., Hefei (JP)

( * ) Notice: Subject to any disclaimer, the term of this patent is extended or adjusted under 35 U.S.C. 154(b) by 27 days.

(21) Appl. No.: 17/453,001

(22) Filed: Oct. 31, 2021

(65) Prior Publication Data

US 2022/0157352 A1    May 19, 2022

Related U.S. Application Data

(63) Continuation of application No. PCT/CN2021/112768, filed on Aug. 16, 2021.

(30) Foreign Application Priority Data

Nov. 18, 2020 (CN) .......................... 202011297404.3

(51) Int. Cl.
*G11C 16/16* (2006.01)
*G11C 7/10* (2006.01)

(52) U.S. Cl.
CPC .................................. *G11C 7/1048* (2013.01)

(58) Field of Classification Search
CPC ................ G11C 7/1048; G11C 29/022; G11C 29/12015; G11C 29/14; G11C 29/028; G11C 7/1084; G11C 2207/2254
See application file for complete search history.

(56) References Cited

U.S. PATENT DOCUMENTS 7,773,440 B2    8/2010  Kim et al.
8,085,061 B2   12/2011  Kinoshita et al.
(Continued)

FOREIGN PATENT DOCUMENTS

| CN | 101261874 B |  5/2012 |
| CN | 107393577 A | 11/2017 |
| CN | 109817258 A |  5/2019 |

(Continued)

OTHER PUBLICATIONS

International Search Report in Application No. PCT/CN2021/112768, dated Oct. 29, 2021.
(Continued)

*Primary Examiner* — Xiaochun L Chen
(74) *Attorney, Agent, or Firm* — SYNCODA LLC; Feng Ma

(57) ABSTRACT

A test method includes: providing an initialization command to a ZQ calibration module such that the resistance value of a termination resistor is a first extreme value; providing a ZQ calibration command to the ZQ calibration module such that the resistance value of the termination resistor increases or decreases to a second extreme value from the first extreme value, one of the first extreme value and the second extreme value being a maximum value while the other one being a minimum value; acquiring a first time node, the first time node being a transmitting time for the ZQ calibration command; acquiring a second time node; and acquiring the ZQ calibration time based on the second time node and the first time node.

8 Claims, 6 Drawing Sheets

(56) References Cited

U.S. PATENT DOCUMENTS

| | | | |
|---|---|---|---|
| 10,747,245 B1 | 8/2020 | He et al. | |
| 2014/0157053 A1* | 6/2014 | Mozak | G11C 29/52 |
| | | | 714/32 |

FOREIGN PATENT DOCUMENTS

| | | |
|---|---|---|
| CN | 111933205 A | 11/2020 |
| EP | 3563246 A1 | 11/2019 |

OTHER PUBLICATIONS

Children of China, "Some knowledge points in DDR (ODT, ZQ calibration, OCT, TDQS)", cnblogs.com, posted on Mar. 1, 2018, cited in the whole document. https://www.cnblogs.com/zhongguo135/p/8486979.html. 15 pages with English translation.

Virtuousliu, "DDR ZQ Calibration", CSDN, May 19, 2020, cited in the whole document. https://blog.csdn.net/LUOHUATINGYUSHENG/article/details/106636576. 8 pages with English translation.

* cited by examiner

US 11,810,639 B2

TEST METHOD AND TEST SYSTEM

CROSS-REFERENCE TO RELATED APPLICATIONS

This is a continuation of International Patent Application No. PCT/CN2021/112768 filed on Aug. 16, 2021, which claims priority to Chinese Patent Application No. 202011297404.3 filed on Nov. 18, 2020. The disclosures of the above-referenced applications are incorporated herein by reference in their entirety.

BACKGROUND

For a semiconductor memory, resistance values of a pull-up resistor and a pull-down resistor at an output terminal will affect the integrity of output signals.

SUMMARY

The present disclosure relates to the field of memory performance testing, and in particular to a test method and a test system.

Embodiments of the present disclosure provide a test method and a test system.

Various embodiments of the present disclosure provide a test method for acquiring a ZQ calibration time of a memory to be tested. The memory to be tested includes a ZQ calibration module, a termination resistor and a DQ terminal, one end of the termination resistor is connected with an operating voltage terminal while the other end is connected with the DQ terminal, and the ZQ calibration module is configured to control the termination resistor to have access to resistance values at the operating voltage terminal to the DQ terminal. The test method includes: providing an initialization command to the ZQ calibration module such that the resistance value of the termination resistor is a first extreme value; providing a ZQ calibration command to the ZQ calibration module such that the resistance value of the termination resistor increases or decreases to a second extreme value from the first extreme value, one of the first extreme value and the second extreme value being a maximum value while the other one being a minimum value; acquiring a first time node, the first time node being a transmitting time for the ZQ calibration command; acquiring a second time node, the second time node being a time at which the resistance value of the termination resistor changes to the second extreme value; and acquiring the ZQ calibration time based on the second time node and the first time node.

Various embodiments of the present disclosure also provide a test system, which is applied to a test machine. The test machine includes: a transmitting unit configured to provide an initialization command and a ZQ calibration command to a memory to be tested; a first acquiring unit configured to acquire a first time node, the first time node being a time for the transmitting unit to transmit the ZQ calibration command; a second acquiring unit configured to acquire a second time node, the second time node being a time at which the resistance value of the termination resistor of the memory to be tested changes to a second extreme value; and a processing unit configured to acquire a ZQ calibration time of the memory to be tested according to the second time node and the first time node.

Figure 1:
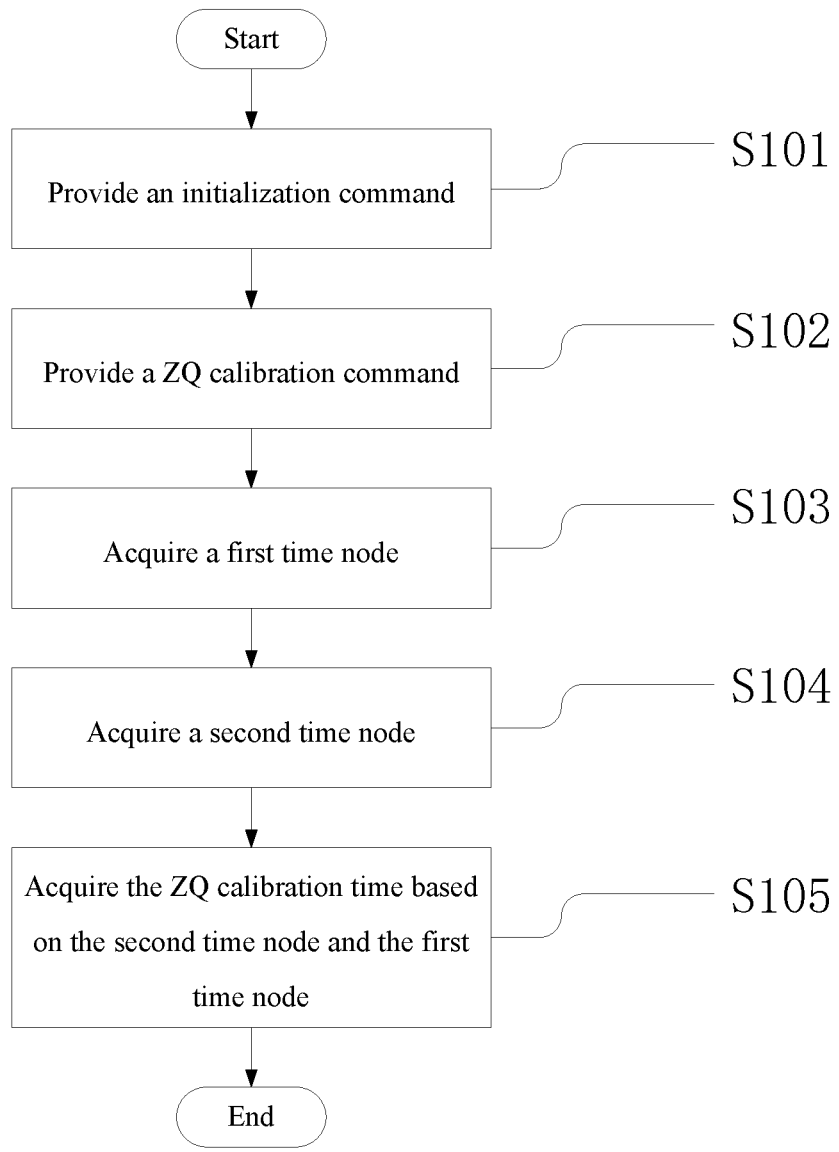
FIG. 1 is a first schematic flow chart of a test method according to a first embodiment of the present disclosure.

$V_{DD}$: voltage at operating voltage terminal;
$R_{tt}$: termination resistor;
DQ: DQ terminal;
$V_{DQ}$: voltage at DQ terminal;
$V_{SS}$: ground voltage;
$I_{out}$: output current at DQ terminal;
t1: first time node;
t2: second time node;
t3: third time node.

DETAILED DESCRIPTION

ZQ calibration is typically employed to adjust the resistance values of the pull-up resistor and the pull-down resistor, with an aim of regulating the output pull-up and/or output pull-down capability. It thus can be seen that for the performance testing of a memory, the specific time for ZQ calibration of this memory may also be regarded as a critical indicator for memory performance evaluation.

Various embodiments of the present disclosure can address how to acquire the specific time for ZQ calibration of the memory is a technical problem that needs to be solved urgently.

That is, for the performance testing of a memory, the specific time for ZQ calibration of this memory may also be regarded as a critical indicator for memory performance evaluation. And how to acquire the specific time for ZQ calibration of the memory is a technical problem that needs to be solved urgently.

To solve the above problem, the first embodiment of the present disclosure provides a test method for acquiring a ZQ calibration time of a memory to be tested. The memory to be tested includes a ZQ calibration module, a termination resistor and a DQ terminal, one end of the termination resistor is connected with an operating voltage terminal while the other end is connected with the DQ terminal, the ZQ calibration module is configured to control the termination resistor to have access to resistance values at the operating voltage terminal to the DQ terminal, and includes: providing an initialization command to the ZQ calibration module such that the resistance value of the termination resistor is a first extreme value; providing a ZQ calibration command to the ZQ calibration module such that the resistance value of the termination resistor increases or decreases to a second extreme value from the first extreme value, one of the first extreme value and the second extreme value being a maximum value while the other one being a minimum value; acquiring a first time node, the first time node being a transmitting time for the ZQ calibration command;

acquiring a second time node, the second time node being a time at which the resistance value of the termination resistor changes to the second extreme value; and acquiring the ZQ calibration time based on the second time node and the first time node.

In order to make the objects, the technical solutions, and the advantages of the embodiments of the present disclosure clearer, the detailed description of the embodiments of the present disclosure is given below in combination with the accompanying drawings. However, the ordinary skills in the art can understand that many technical details are provided in the embodiments of the present disclosure so as to make the readers better understand the present disclosure. However, even if these technical details are not provided and based on a variety of variations and modifications of the following embodiments, the technical solutions sought for protection in the present disclosure can also be realized. The following embodiments are divided for convenience of description, and should not constitute any limitation to the implementation of the present disclosure. The embodiments may be combined with each other and referred to each other without contradiction.

Figure 2:
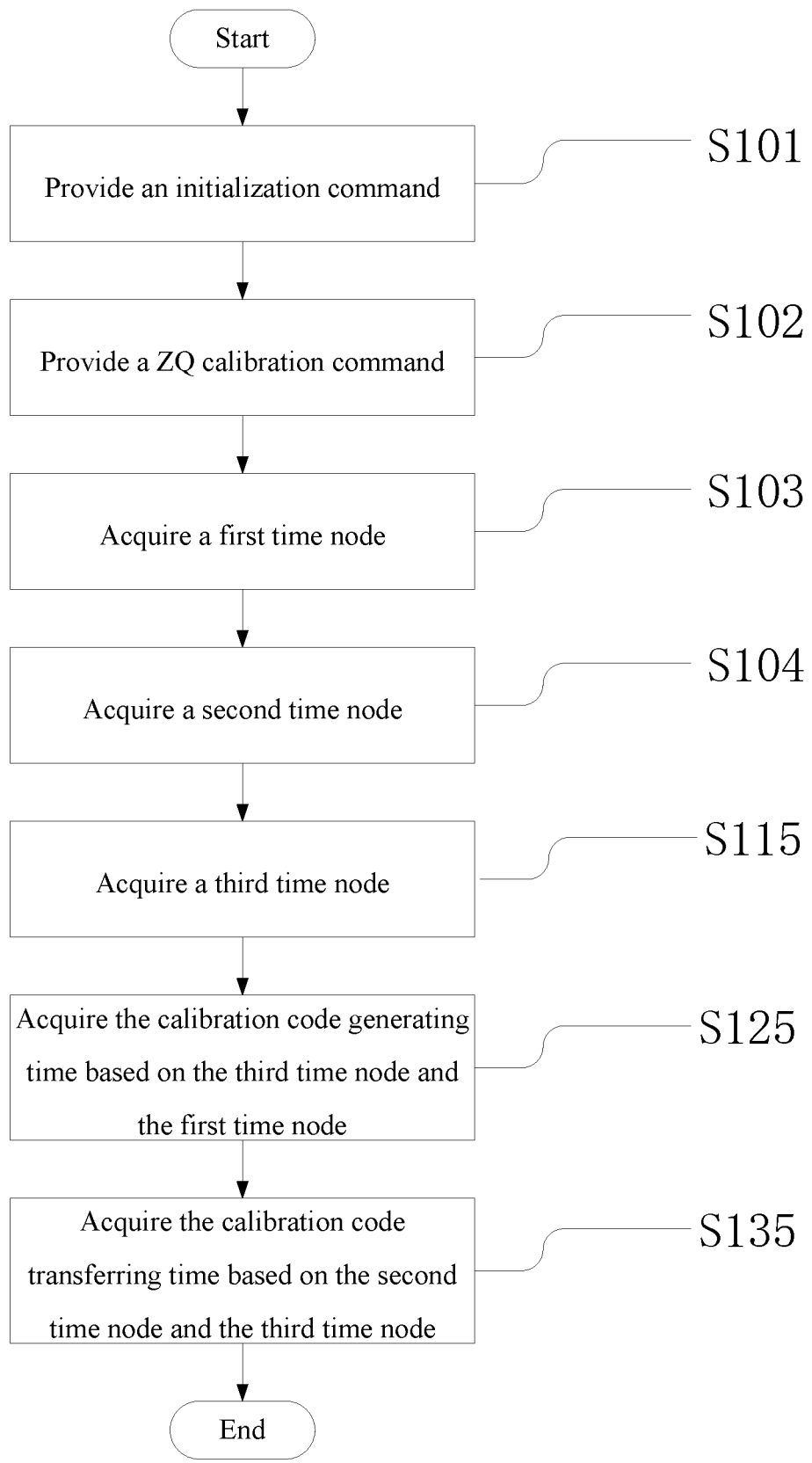
FIG. 2 is a second schematic flow chart of a test method according to a first embodiment of the present disclosure.
Figure 3:
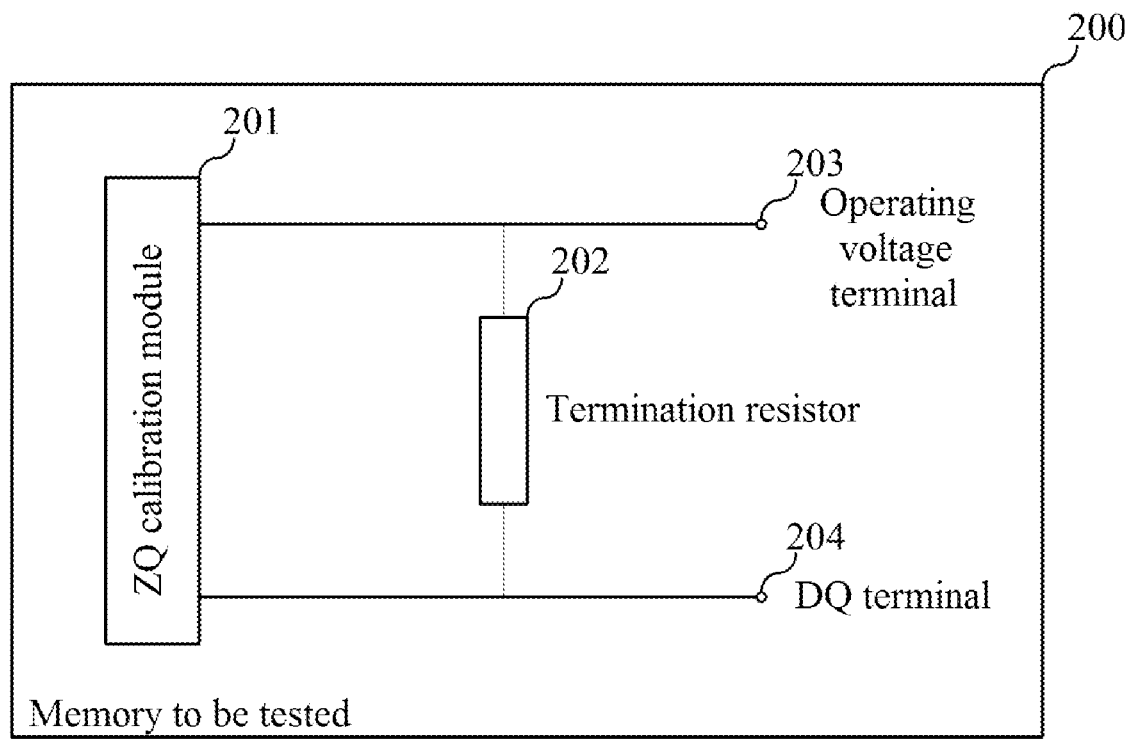
FIG. 3 is a schematic structural diagram of a memory to be tested according to the first embodiment of the present disclosure.

FIG. 1 and FIG. 2 are schematic flow charts of a test method according to the first embodiment of the present disclosure, FIG. 3 is a schematic structural diagram of a memory to be tested according to the first embodiment of the present disclosure; FIG. 4 to FIG. 8 are schematic diagrams of the test method according to the first embodiment of the present disclosure, and the test method according to the present embodiment will be described below in details in conjunction with the accompanying drawings.

Referring to FIG. 3, the test method is used to acquire a ZQ calibration time of a memory to be tested 200. The memory to be tested 200 includes a ZQ calibration module 201, a termination resistor 202 and a DQ terminal 204, one end of the termination resistor 202 is connected with an operating voltage terminal 203 while the other end is connected with the DQ terminal 204, and the ZQ calibration module 201 is configured to control the termination resistor 202 to have access to resistance values at the operating voltage terminal 203 to the DQ terminal 204.

Referring to FIG. 1 and in conjunction with FIG. 3, the test method includes the following steps:

S101: providing an initialization command.

In particular, the initialization command is provided to the ZQ calibration module 201 such that the resistance value of the termination resistor 202 is a first extreme value.

S102: providing a ZQ calibration command.

In particular, the ZQ calibration command is provided to the ZQ calibration module such that the resistance value of the termination resistor increases or decreases to a second extreme value from the first extreme value, and one of the first extreme value and the second extreme value is a maximum value while the other one is a minimum value.

In an alternate embodiment, a detailed description in which the output voltage at the DQ terminal is taken as an example and the first extreme value is the minimum value while the second extreme value is the maximum value is provided merely to exemplify the present embodiment, and to help those skilled in the art appreciate the implementation of the present solution. It shall be noted that the fact that the first extreme value is the minimum value while the second extreme value is the maximum value does not constitute a limitation to the present embodiment. In other embodiments, the first extreme value may be the maximum value while the second extreme value may be the minimum value.

As an existing unit design in the current semiconductor memory, the ZQ calibration module 201 is configured to perform ZQ calibration on the semiconductor memory in response to the ZQ calibration command. A ZQ pin of the semiconductor memory is externally connected with a reference resistor that typically has a resistance of 240 Ohms. During ZQ calibration by the ZQ calibration module 201, the ZQ calibration module 201 will compare the resistance values of an output pull-up resistor and an output pull-down resistor inside the semiconductor memory with the resistance value of the reference resistor, such that the resistance values of the output pull-up resistor and the output pull-down resistor are matched with the resistance value of the reference resistor, and corresponding calibration codes are generated and subsequently transmitted to the termination resistor 202 at the DQ terminal 204, i.e., an output resistor with its output in driving connection with the DQ terminal 204. It is to be noted that the termination resistor 202 in FIG. 3 does not refer to a single resistor, but is characterized by a collection of output resistors with their outputs in driving connection with the DQ terminal 204.

In the present embodiment, the resistance value of the termination resistor 202 changes to the minimum value through the initialization command, the memory then begins performing ZQ calibration through the ZQ calibration command, and the resistance value of the termination resistor 202 increases to the maximum value. When the resistance value of the termination resistor 202 increases to the maximum value, the memory finishes ZQ calibration. The actual time for the memory to execute the ZQ calibration command can be accurately characterized by the time at which the ZQ calibration command is transmitted and the time at which the resistance value of the termination resistor 202 changes to the maximum value.

S103: acquiring a first time node. The first time node is a transmitting time for the ZQ calibration command.

Figure 5:
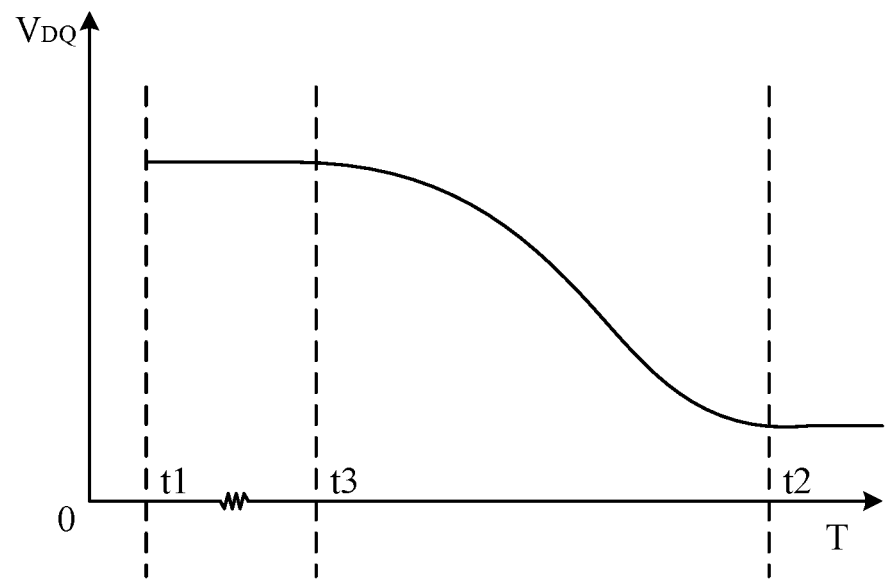
FIG. 5 is a second schematic diagram of the test method according to the first embodiment of the present disclosure.
Figure 6:
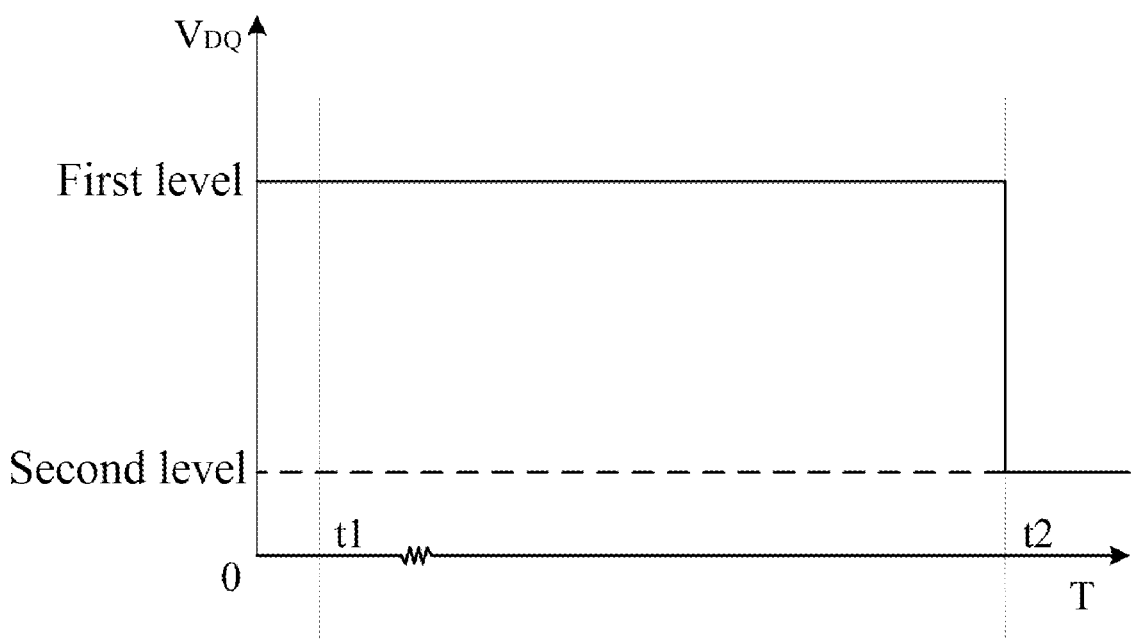
FIG. 6 is a third schematic diagram of the test method according to the first embodiment of the present disclosure.

In particular, when an external device transmits the ZQ calibration command to the memory to be tested, the current time is acquired as the first time node. The time for a procedure in which the ZQ calibration command is transmitted by the external device to the memory to be tested is negligible. With reference to FIG. 5, the transmitting time for the ZQ calibration command is acquired as the first time node t1.

With continued reference to FIG. 1, S104: acquiring a second time node. The second time node is a time at which the resistance value of the termination resistor 202 changes to the second extreme value.

In particular, the change in the resistance value of the termination resistor 202 is monitored in real-time. The current time is acquired as the second time node when the resistance value of the termination resistor 202 changes to the maximum value.

Figure 4:
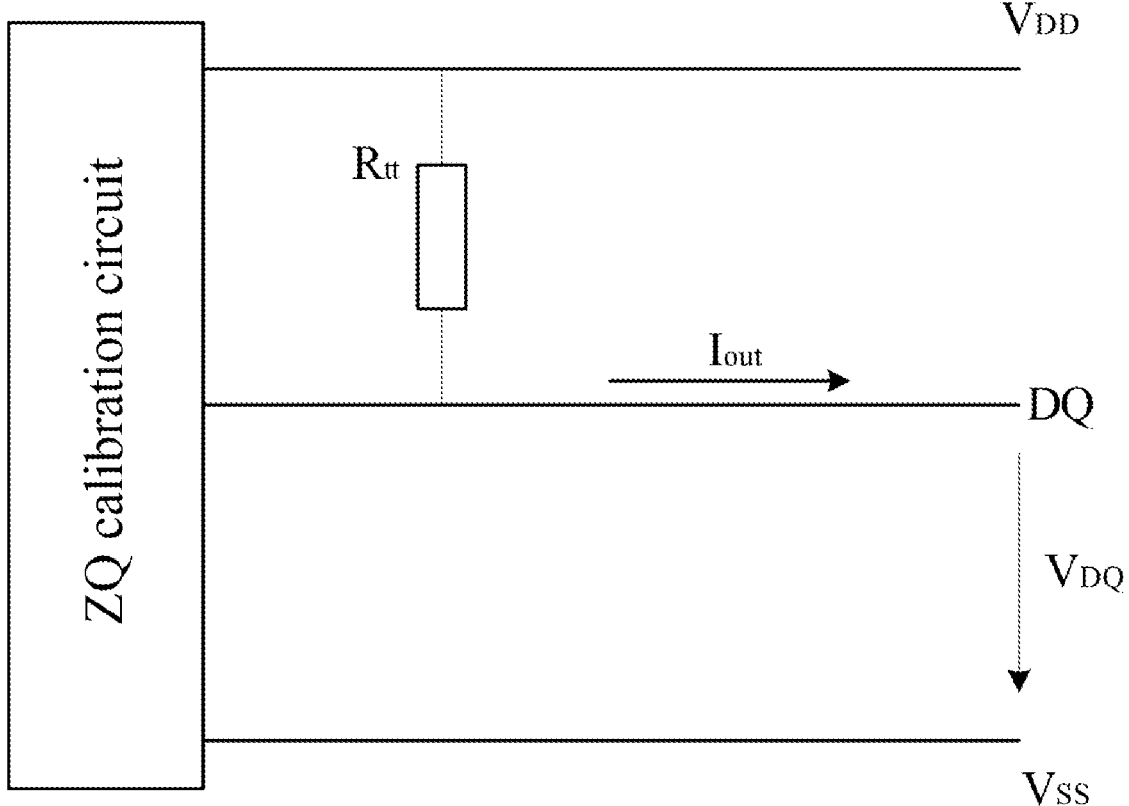
FIG. 4 is a first schematic diagram of the test method according to the first embodiment of the present disclosure.

In an alternate embodiment, the second time node is acquired by detecting an output voltage at the DQ terminal 204. In particular, the second time node is a time node at which the output voltage at the DQ terminal changes to the second extreme value, and its principle is as shown in FIG. 4. One end of the termination resistor $R_{tt}$ is connected to the operating voltage terminal while the other end is connected to the DQ terminal. The voltage $V_{DD}$ at the operating voltage terminal is divided by the termination resistor, i.e., the greater the resistance value loaded on the termination resistor $R_{tt}$, the greater the voltage loaded across the termination resistor $R_{tt}$ and the smaller the output voltage $V_{DQ}$ at the DQ terminal (relative to a ground voltage $V_{SS}$). Referring to FIG. 5, when the resistance value of the termination resistor $R_{tt}$ is the maximum value, the voltage loaded across the termination resistor $R_{tt}$ also reaches the maximum value, and at this moment, the output voltage $V_{DQ}$ at the DQ terminal has the minimum value, i.e., the second time node t2 is acquired when the output voltage $V_{DQ}$ at the DQ terminal changes to the minimum value.

With continued reference to FIG. 5, when the resistance value of the termination resistor $R_{tt}$ gets close to the maximum value, the resistance value of the termination resistor $R_{tt}$ changes slowly. When the second time node is acquired, the time node at which $V_{DQ}$ changes to the minimum value cannot be accurately acquired.

In an alternate embodiment, the method of acquiring the second time node includes: dividing the output voltage at the DQ terminal into a first level and a second level, the first level satisfying a preset range of the second extreme value and the second level not satisfying the preset range of the second extreme value, acquiring a transition time for the first level and the second level, and regarding the transition time as the second time node t2.

In an example, the resistance value of the termination resistor $R_{tt}$ changes from the minimum value to the maximum value. At this moment, the output voltage $V_{DQ}$ at the DQ terminal changes from the maximum value to the minimum value. Division into the first level and the second level is achieved under a preset range with the minimum value of $V_{DQ}$ and an error of 5%. In case of 0.95 $V_{DQ}$<$V_{DQ}$ actual voltage<1.00 $V_{DQ}$, $V_{DQ}$ actual voltage is at the second level; and in case of $V_{DQ}$ actual voltage<0.95 $V_{DQ}$, $V_{DQ}$ actual voltage is at the first level. At this moment, there will be a time node for one transition during the change of $V_{DQ}$. With the time node for this transition as the second time node, the time node at which $V_{DQ}$ changes to the minimum value can be acquired simply and accurately.

S105: acquiring the ZQ calibration time based on the second time node and the first time node In particular, the time difference between the second time node and the first time node is regarded as the ZQ calibration time of the memory to be tested.

As can be seen from the foregoing content, the ZQ calibration time of the memory to be tested includes a calibration code generating stage and a calibration code transferring stage, i.e., the ZQ calibration time includes a calibration code generating time and a calibration code transferring time. In particular, referring to FIG. 2, S105 specifically includes:

S115: acquiring a third time node. The third time node is a time at which the resistance value of the termination resistor 202 begins to change.

In an alternate embodiment, the third time node is acquired by detecting the output voltage at the DQ terminal 204. In particular, the third time node is a time node at which the output voltage at the DQ terminal begins to change, and its principle is as shown in FIG. 4. One end of the termination resistor Ru is connected to a $V_{DD}$ terminal while the other end is connected to the DQ terminal. $V_{DD}$ is divided by the termination resistor, i.e., the greater the resistance value loaded on the termination resistor Ru, the greater the voltage loaded across the termination resistor Ru and the smaller the output voltage $V_{DQ}$ at the DQ terminal. Referring to FIG. 5, when the resistance value of the termination resistor $R_{tt}$ begins to change, the voltage loaded across the termination resistor $R_{tt}$ also begins to change, and at this moment, the output voltage $V_{DQ}$ at the DQ terminal begins to change as well, i.e., the third time node t3 is acquired when the output voltage $V_{DQ}$ at the DQ terminal begins to change.

In particular, the change in the resistance value of the termination resistor 202 is monitored in real-time. The current time is acquired as the third time node when the resistance value of the termination resistor 202 changes.

S125: acquiring the calibration code generating time based on the third time node and the first time node.

In particular, the time difference between the third time node and the first time node is regarded as the calibration code generating time of the memory to be tested. The calibration code generating time is a time for the procedure in which the ZQ calibration module 201 will compare the resistance values of an output pull-up resistor and an output pull-down resistor inside the semiconductor memory with the resistance value of the reference resistor, such that the resistance values of the output pull-up resistor and the output pull-down resistor are matched with the resistance value of the reference resistor, and corresponding calibration codes are generated.

S135: acquiring the calibration code transferring time based on the second time node and the third time node.

In particular, the time difference between the second time node and the third time node is regarded as the calibration code transferring time of the memory to be tested. The calibration code transferring time is a time for the procedure in which the calibration codes are transmitted to the termination resistor 202 at the DQ terminal 204, i.e., an output resistor with its output in driving connection with the DQ terminal 204, and the termination resistor 202 is regulated according to the calibration codes.

It is to be noted that in an alternate embodiment, acquiring the change in the resistance of the termination resistor 202 by detecting the change in the output voltage $V_{DQ}$ at the DQ terminal 204 does not constitute a limitation to the present embodiment.

Figure 7:
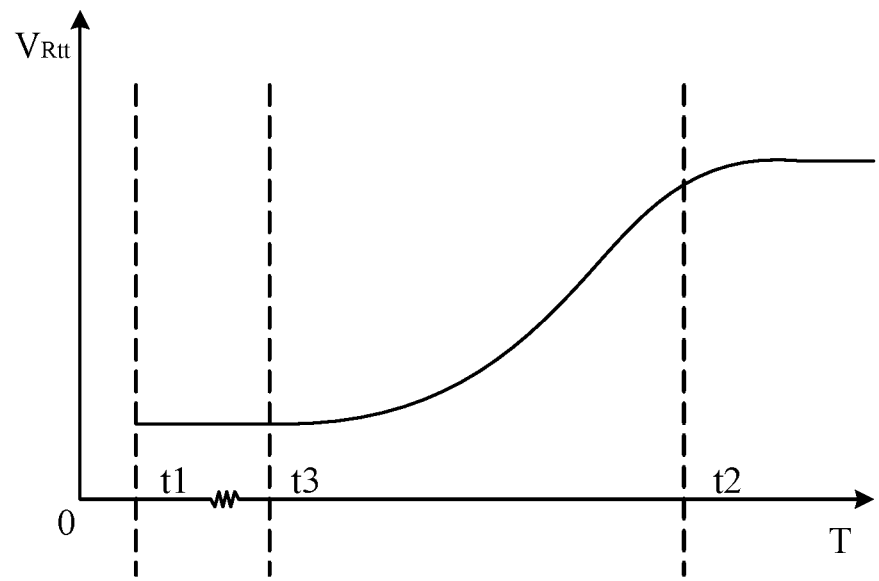
FIG. 7 is a fourth schematic diagram of the test method according to the first embodiment of the present disclosure.

In other embodiments, the change in the resistance of the termination resistor $R_{tt}$ may also be acquired according to the change in the voltage $V_{Rtt}$ loaded across the termination resistor $R_{tt}$, and its principle is as shown in FIG. 7. When the resistance value of the termination resistor $R_{tt}$ is the minimum value, the voltage $V_{Rtt}$ loaded across the termination resistor $R_{tt}$ also has the minimum value; the voltage $V_{Rtt}$ loaded across the termination resistor $R_{tt}$ increases along with the increase in the resistance value of the termination resistor $R_{tt}$; and when the resistance value of the termination resistor $R_{tt}$ is the maximum value, the voltage $V_{Rtt}$ loaded across the termination resistor $R_{tt}$ also has the maximum value. The ZQ calibration time of the memory to be tested is acquired by acquiring the transmitting time for the ZQ calibration command, as the first time node t1, by acquiring the time at which the voltage $V_{Rtt}$ loaded across the termination resistor $R_{tt}$ begins to change, as the third time node t3, and by acquiring the time at which the voltage $V_{Rtt}$ loaded across the termination resistor $R_{tt}$ changes to the maximum value, as the second time node t2.

Figure 8:
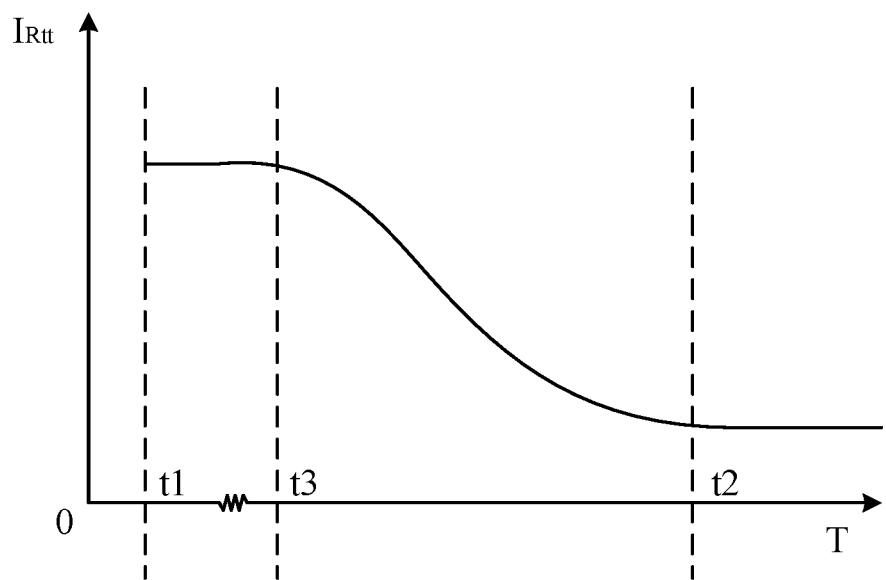
FIG. 8 is a fifth schematic diagram of the test method according to the first embodiment of the present disclosure.

In addition, the change in the resistance of the termination resistor $R_{tt}$ may also be acquired according to the change in a current $I_{Rtt}$ passing through the termination resistor $R_{tt}$, and its principle is as shown in FIG. 8. When the resistance value of the termination resistor $R_{tt}$ is the minimum value, the current $I_{Rtt}$ passing through the termination resistor $R_{tt}$ has the maximum value; the current $I_{Rtt}$ passing through the termination resistor $R_{tt}$ decreases along with the increase in the resistance value of the termination resistor $R_{tt}$; and when the resistance value of the termination resistor $R_{tt}$ is the maximum value, the current $I_{Rtt}$ passing through the termination resistor $R_{tt}$ has the minimum value. The ZQ calibration time of the memory to be tested is acquired by acquiring the transmitting time for the ZQ calibration command, as the first time node t1, by acquiring the time at which the current $I_{Rtt}$ passing through the termination resistor $R_{tt}$ begins to change, as the third time node t3, and by acquiring the time at which the current $I_{Rtt}$ passing through the termination resistor $R_{tt}$ changes to the minimum value, as the second time node t2.

Compared with the related art, the resistance value of the termination resistor of the memory to be tested is changed to an extreme value by the initialization command and then to another extreme value by the ZQ calibration command. At this moment, the termination resistor has encountered the greatest change in its resistance value and the actual time for ZQ calibration can be accurately characterized accordingly. Afterwards, the time for ZQ calibration of the memory to be tested is read out in accordance with the time node at which the ZQ calibration command is transmitted and the time node at which the change in the resistance value of the termination resistor is completed.

It is worth mentioning that the division of the various steps above is merely for clarity of description. The steps may be combined into one step or some of the steps may be split into a plurality of steps when being implemented, and all of these fall within the protection scope of the present patent as long as they have a same logic relationship. Adding insignificant modifications to the flow or introducing inessential designs without changing key designs of the flow fall within the protection scope of the patent.

The second embodiment of the present disclosure relates to a test system, which is applied to a test machine. The test machine includes: a transmitting unit configured to provide an initialization command and a ZQ calibration command to a memory to be tested; a first acquiring unit configured to acquire a first time node, the first time node being a time for the transmitting unit to transmit the ZQ calibration command; a second acquiring unit configured to acquire a second time node, the second time node being a time at which the resistance value of the termination resistor of the memory to be tested changes to a second extreme value; and a processing unit configured to acquire a ZQ calibration time of the memory to be tested according to the second time node and the first time node.

Figure 9:
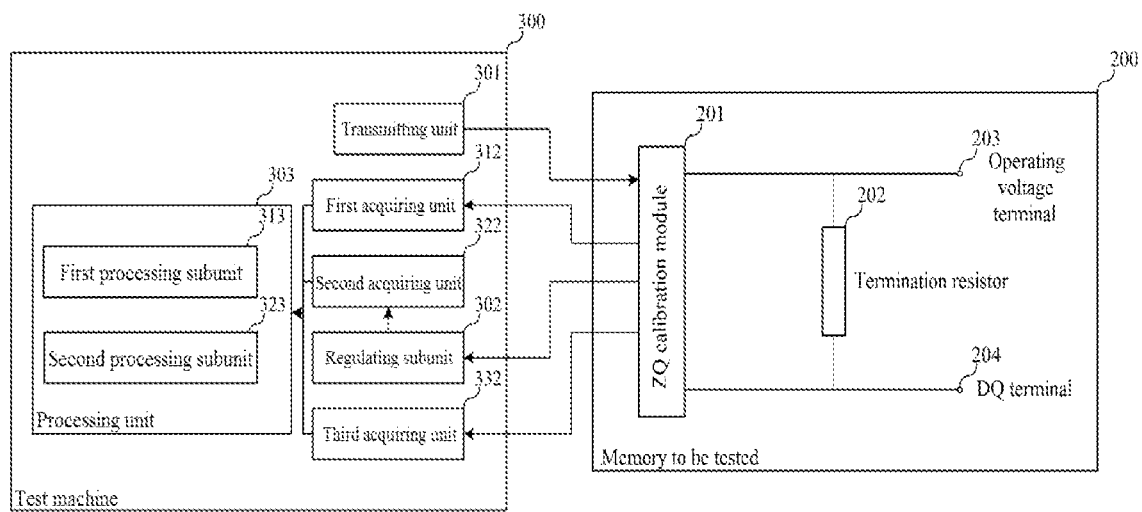
FIG. 9 is a schematic structural diagram of a test system according to a second embodiment of the present disclosure.

FIG. 9 is a schematic structural diagram of a test system according to the second embodiment of the present disclosure. The test system according to the present embodiment will be described in details below with reference to the accompanying drawings. The sections that are the same as or corresponding to those in the first embodiment will not be described in details below.

Referring to FIG. 9, the test system includes a test machine 300 and a memory to be tested 200.

The memory to be tested 200 includes a ZQ calibration module 201, a termination resistor 202 and a DQ terminal 204, one end of the termination resistor 202 is connected with an operating voltage terminal 203 while the other end is connected with the DQ terminal 204, and the ZQ calibration module 201 is configured to control the termination resistor 202 to have access to resistance values at the operating voltage terminal 203 to the DQ terminal 204.

The test machine 300 includes:
 a transmitting unit 301 configured to provide an initialization command and a ZQ calibration command to the memory to be tested 200;
 a first acquiring unit 312 configured to acquire a first time node, the first time node being a time for the transmitting unit 301 to transmit the ZQ calibration command;
 a second acquiring unit 322 configured to acquire a second time node, the second time node being a time at which the resistance value of the termination resistor 202 of the memory to be tested 200 changes to a second extreme value; and
 a processing unit 303 configured to acquire a ZQ calibration time of the memory to be tested 200 according to the second time node and the first time node.

In particular, the ZQ calibration time includes a calibration code generating time and a calibration code transferring time.

The test system also includes: a third acquiring unit 332 configured to acquire a third time node, the third time node being a time node at which the resistance value of the termination resistor 202 begins to change.

The processing unit 303 includes a first processing subunit 313 and a second processing subunit 323.

The first processing subunit 313 is configured to acquire the calibration code generating time according to the third time node and the first time node. The calibration code generating time is a time for the procedure in which the ZQ calibration module 201 will compare the resistance values of an output pull-up resistor and an output pull-down resistor inside the semiconductor memory with the resistance value of the reference resistor, such that the resistance values of the output pull-up resistor and the output pull-down resistor are matched with the resistance value of the reference resistor, and corresponding calibration codes are generated.

The second processing subunit 323 is configured to acquire the calibration code transferring time according to the second time node and the third time node. The calibration code transferring time is a time for the procedure in which the calibration codes are transmitted to the termination resistor 202 at the DQ terminal 204, i.e., an output resistor with its output in driving connection with the DQ terminal 204, and the termination resistor 202 is regulated according to the calibration codes.

In an alternate embodiment, the second acquiring unit 322 and the third acquiring unit 332 acquire the second time node and the third time node by acquiring the output voltage at the DQ terminal 204 of the memory to be tested 200. In particular, the second time node is a time node at which the output voltage at the DQ terminal 204 changes to the second extreme value, and the third time node is a time node at which the output voltage at the DQ terminal 204 begins to change.

In other embodiments, the second acquiring unit and the third acquiring unit acquire the second time node and the third time node by acquiring the voltage loaded across the termination resistor in the memory to be tested. In particular, the second time node is a time node at which the voltage loaded across the termination resistor changes to the second extreme value, and the third time node is a time node at which the voltage loaded across the termination resistor begins to change. In addition, the second acquiring unit and the third acquiring unit acquire the second time node and the third time node by acquiring the current passing through the termination resistor in the memory to be tested. In particular, the second time node is a time node at which the current passing through the termination resistor changes to the second extreme value, and the third time node is a time node at which the current passing through the termination resistor begins to change.

When the resistance value of the termination resistor 202 gets close to the maximum value, the resistance value of the termination resistor 202 changes slowly. When the second time node is acquired, the time node at which the output voltage at the DQ terminal 204 changes to the minimum value cannot be accurately acquired. In an alternate embodiment, the test system further includes: a regulating subunit 302 configured to divide the output voltage at the DQ terminal 204 into a first level and a second level, the first level satisfying a preset range of the second extreme value and the second level not satisfying the preset range of the second extreme value; the second acquiring unit 322 is configured to acquire a transition time for the first level and the second level, and regard the transition time as the second time node. With the time node for this transition as the second time node, the time node at which the output voltage at the DQ terminal 204 changes to the second extreme value can be acquired simply and accurately.

The resistance value of the termination resistor of the memory to be tested is changed to an extreme value by providing the initialization command to the memory to be tested through the test machine, and then to another extreme value by providing the ZQ calibration command to the memory to be tested through the test machine. At this moment, the termination resistor has encountered the greatest change in its resistance value and the actual time for ZQ calibration of the memory to be tested can be accurately characterized accordingly. Afterwards, the time for ZQ calibration of the memory to be tested is read out in accordance with the time node at which the ZQ calibration command is transmitted and the time node at which the change in the resistance value of the termination resistor is completed.

Various embodiments of the present disclosure can have one or more of the following advantages.

The resistance value of the termination resistor of the memory to be tested is changed to an extreme value by providing the initialization command to the memory to be tested through the test machine, and then to another extreme value by providing the ZQ calibration command to the memory to be tested through the test machine. At this moment, the termination resistor has encountered the greatest change in its resistance value and the actual time for ZQ calibration of the memory to be tested can be accurately characterized accordingly. Afterwards, the time for ZQ calibration of the memory to be tested is read out in accordance with the time node at which the ZQ calibration command is transmitted and the time node at which the change in the resistance value of the termination resistor is completed.

It is worth mentioning that all of the units which are involved in the present embodiment are logical units. In practical disclosure, a logical unit may be a physical unit, and may also be a part of a physical unit, and may further be implemented in a combination of several physical units. In addition, in order to highlight the novel parts of the present disclosure, the present embodiment does not introduce units which are not closely tied to the solutions to the technical problems proposed in the present disclosure, but it does not mean no other units exist in the present embodiment.

Since the first embodiment and the present embodiment correspond to each other, the present embodiment may be implemented cooperatively with the first embodiment. The related technical details mentioned in the first embodiment remains valid in the present embodiment. The technical effects achieved in the first embodiment may also be realized in the present embodiment. In order to reduce repetitions, no description is given here. Correspondingly, the related technical details mentioned in the present embodiment may also be applied in the first embodiment.

Those ordinary skills in the art can understand that the embodiments described above are particular embodiments for implementing the present disclosure. In practical uses, various changes in forms and details may be made to the implementations without departing from the spirit and scope of the present disclosure. Any skills in the art may make their own changes and modifications without departing from the spirit and scope of the present disclosure. Therefore, the protection scope of the present disclosure shall be subject to the protection scope of the claims.

What is claimed is:

1. A test method for acquiring a ZQ calibration time of a memory to be tested, the memory to be tested comprising a ZQ calibration module, a termination resistor and a DQ terminal, one end of the termination resistor being connected with an operating voltage terminal while the other end being connected with the DQ terminal, the ZQ calibration module being configured to control the termination resistor to have access to resistance values at the operating voltage terminal to the DQ terminal, the test method comprising:
   providing an initialization command to the ZQ calibration module such that the resistance value of the termination resistor is a first extreme value;
   providing a ZQ calibration command to the ZQ calibration module such that the resistance value of the termination resistor increases or decreases to a second extreme value from the first extreme value, one of the first extreme value and the second extreme value being a maximum value while the other one being a minimum value;
   acquiring a first time node, the first time node being a transmitting time for the ZQ calibration command;
   acquiring a second time node, the second time node being a time at which the resistance value of the termination resistor changes to the second extreme value; and
   acquiring the ZQ calibration time based on the second time node and the first time node;
   wherein the ZQ calibration time comprises a calibration code generating time and a calibration code transferring time, and acquiring the ZQ calibration time comprises:
   acquiring a third time node, the third time node being a time at which the resistance value of the termination resistor starts to change;
   acquiring the calibration code generating time based on the third time node and the first time node; and
   acquiring the calibration code transferring time based on the second time node and the third time node.

2. The test method according to claim 1, wherein the second time node and the third time node are acquired by detecting an output voltage at the DQ terminal;
   the third time node is a time node at which the output voltage at the DQ terminal starts to change;
   the second time node is a time node at which the output voltage at the DQ terminal changes to the second extreme value.

3. The test method according to claim 2, wherein the method of acquiring the second time node comprises:
   dividing the output voltage at the DQ terminal into a first level and a second level, the first level satisfying a preset range of the second extreme value and the second level not satisfying the preset range of the second extreme value; and
   acquiring a transition time for the first level and the second level, and regarding the transition time as the second time node.

4. The test method according to claim 1, wherein the second time node and the third time node are acquired by detecting a current passing through the termination resistor;

the third time node is a time node at which the current passing through the termination resistor starts to change;

the second time node is a time node at which the current passing through the termination resistor changes to the second extreme value.

5. The test method according to claim 1, wherein the second time node and the third time node are acquired by detecting a voltage across the termination resistor;

the third time node is a time node at which the voltage across the termination resistor starts to change;

the second time node is a time node at which the voltage across the termination resistor changes to the second extreme value.

6. A test system applied to a test machine, the test machine comprising:

a transmitting unit configured to provide an initialization command and a ZQ calibration command to a memory to be tested;

a first acquiring unit configured to acquire a first time node, the first time node being a time for the transmitting unit to transmit the ZQ calibration command;

a second acquiring unit configured to acquire a second time node, the second time node being a time at which the resistance value of the termination resistor of the memory to be tested changes to a second extreme value; and a processing unit configured to acquire a ZQ calibration time of the memory to be tested according to the second time node and the first time node;

wherein:

the ZQ calibration time comprises a calibration code generating time and a calibration code transferring time; the test system further comprises: a third acquiring unit configured to acquire a third time node, the third time node being a time node at which the resistance value of the termination resistor starts to change;

the processing unit comprises a first processing subunit and a second processing subunit;

the first processing subunit is configured to acquire the calibration code generating time based on the third time node and the first time node; and the second processing subunit is configured to acquire the calibration code transferring time based on the second time node and the third time node.

7. The test system according to claim 6, wherein the second acquiring unit and the third acquiring unit acquire the second time node and the third time node by acquiring an output voltage at a DQ terminal of the memory to be tested;

the second time node is a time node at which the output voltage at the DQ terminal changes to the second extreme value, and the third time node is a time node at which the output voltage at the DQ terminal starts to change.

8. The test system according to claim 7, wherein the test system further comprises: a regulating subunit configured to divide the output voltage at the DQ terminal into a first level and a second level, the first level satisfying a preset range of the second extreme value and the second level not satisfying the preset range of the second extreme value;

the second acquiring unit is configured to acquire a transition time for the first level and the second level, and regard the transition time as the second time node.

* * * * *